US012610435B2

(12) United States Patent
Huang et al.

(10) Patent No.: US 12,610,435 B2
(45) Date of Patent: Apr. 21, 2026

(54) MICROWAVE HEATING METHOD AND MICROWAVE HEATING DEVICE

(71) Applicant: Industrial Technology Research Institute, Hsinchu (TW)

(72) Inventors: Kun-Ping Huang, Miaoli County (TW); Joseph Poujiong Wang, New Taipei City (TW); Ming-Tsan Peng, Taoyuan City (TW)

(73) Assignee: Industrial Technology Research Institute, Hsinchu (TW)

( * ) Notice: Subject to any disclaimer, the term of this patent is extended or adjusted under 35 U.S.C. 154(b) by 906 days.

(21) Appl. No.: 17/551,198

(22) Filed: Dec. 15, 2021

(65) Prior Publication Data

US 2022/0346199 A1     Oct. 27, 2022

Related U.S. Application Data

(60) Provisional application No. 63/179,555, filed on Apr. 26, 2021.

(51) Int. Cl.
| | |
|---|---|
| *H05B 6/68* | (2006.01) |
| *G01R 29/14* | (2006.01) |
| *H05B 6/72* | (2006.01) |

(52) U.S. Cl.
CPC ............ *H05B 6/686* (2013.01); *G01R 29/14* (2013.01); *H05B 6/72* (2013.01); *H05B 2206/044* (2013.01)

(58) Field of Classification Search
CPC .... H05B 6/686; H05B 6/72; H05B 2206/044; H05B 6/705; H05B 6/6447; H05B 6/688;

(Continued)

(56) References Cited

U.S. PATENT DOCUMENTS 7,569,800 B2     8/2009  Tian et al.
9,462,635 B2 *  10/2016  Bilchinsky ............. H05B 6/705
(Continued)

FOREIGN PATENT DOCUMENTS

| CN | 104006157 | 8/2014 |
|---|---|---|
| CN | 102934518 | 7/2015 |

(Continued)

OTHER PUBLICATIONS

Machine translation of JP-5169255:Mihara, Microwave Processing Apparatus (Year: 2013).*

(Continued)

*Primary Examiner* — Vy T Nguyen
*Assistant Examiner* — Abigail H Rhue
(74) *Attorney, Agent, or Firm* — JCIPRNET

(57)     ABSTRACT

A microwave heating method and a microwave heating device are provided. The microwave heating method includes the following steps. An electric field mode distribution at each frequency point generated by the microwave outputted from each input port of the heating chamber is calculated. A frequency, phase, and power of the microwave outputted from each input port are changed to generate a corresponding electric field mode distribution. The electric field mode distributions generated by the input ports are synthesized into a synthesized electric field mode distribution. A power density distribution is calculated. It is calculated whether spatial uniformity of the power density distribution is greater than a target value. The controller heats the object to be heated through the microwave corresponding to the frequency, phase, and power emitted by the microwave transmitter corresponding to each input port.

19 Claims, 7 Drawing Sheets

(58) Field of Classification Search
CPC .......... H05B 6/68; H05B 6/70; H05B 6/6455;
H05B 6/00; H05B 6/687; H05B 1/02;
G01R 29/14; Y02B 40/00
USPC ........................................ 219/746, 747, 748
See application file for complete search history.

(56) References Cited

U.S. PATENT DOCUMENTS

| | | | |
|---|---|---|---|
| 9,590,573 B2 | 3/2017 | Rust, III et al. | |
| 10,231,293 B2 | 3/2019 | Chang et al. | |
| 10,692,742 B2 | 6/2020 | Huang et al. | |
| 10,772,166 B2 | 9/2020 | Lanza et al. | |
| 10,893,581 B2 * | 1/2021 | Ibragimov | H05B 6/6488 |
| 11,281,245 B1 * | 3/2022 | Joly | H03F 1/32 |
| 2007/0215607 A1 | 9/2007 | Wander et al. | |
| 2009/0184399 A1 | 7/2009 | Kowalski et al. | |
| 2010/0283132 A1 | 11/2010 | Shapoval et al. | |
| 2014/0367377 A1 | 12/2014 | Monden et al. | |
| 2017/0135163 A1 | 5/2017 | Chang et al. | |
| 2018/0323091 A1 * | 11/2018 | Rao | H01L 21/67115 |
| 2019/0313488 A1 | 10/2019 | Ha et al. | |

FOREIGN PATENT DOCUMENTS

| | | | |
|---|---|---|---|
| CN | 107505600 A | * | 12/2017 |
| CN | 108633122 | | 10/2018 |
| CN | 109156053 | | 1/2019 |
| CN | 109951911 | | 6/2019 |
| CN | 108139080 | | 1/2020 |
| CN | 110708778 | | 1/2020 |
| CN | 106686792 | | 5/2020 |
| CN | 111200884 | | 5/2020 |
| CN | 111578648 | | 8/2020 |
| CN | 111669860 | | 9/2020 |
| JP | 5169255 B2 * | 3/2013 | ............. H05B 6/686 |
| TW | 201526713 | 7/2015 | |
| TW | I568316 | 1/2017 | |
| TW | 201739710 | 11/2017 | |
| TW | 201907506 | 2/2019 | |
| TW | I649806 | 2/2019 | |
| TW | I689226 | 3/2020 | |
| TW | I694746 | 5/2020 | |
| WO | 2004077502 | 9/2004 | |

OTHER PUBLICATIONS

Machine translation of CN-107505600: Li, Multifunction chip circuit (Year: 2017).*
"Office Action of Taiwan Counterpart Application", issued on Sep. 1, 2023, p. 1-p. 3.
Eun-Ki Hong et al., "Effect of microwave annealing on SOI MOSFETs: Post-metal annealing with low thermal budget", Micro-electronics Reliability, Jan. 2018, pp. 306-311.
Alan J. Fenn, "A Review of Adaptive Microwave and RF Phased Arrays for Thermotherapy Treatment of Cancer", 2018 IEEE International Symposium on Antennas and Propagation & USNC/URSI National Radio Science Meeting, Jul. 2018, pp. 17-18.
Chu-Jung Ko et al., "Microwave Annealing of Polymer Photovoltaic Devices", Advanced Materials, Nov. 2007, pp. 3520-3523.
Yao-Jen Lee et al., "Low-Temperature Microwave Annealing Processes for Future IC Fabrication—A Review", IEEE Transactions on Electron Devices, Mar. 2014, pp. 651-665.
Chaochao Fu et al., "Understanding the microwave annealing of silicon", AIP Advances, Mar. 15, 2017, pp. 1-8.
Jia Wei Lin et al., "Low-Temperature Microwave Annealing Process for In0.53Ga0.47As MOSFETs", 2017 International Conference on Solid State Devices and Materials, Sep. 2017, pp. 771-772.

* cited by examiner

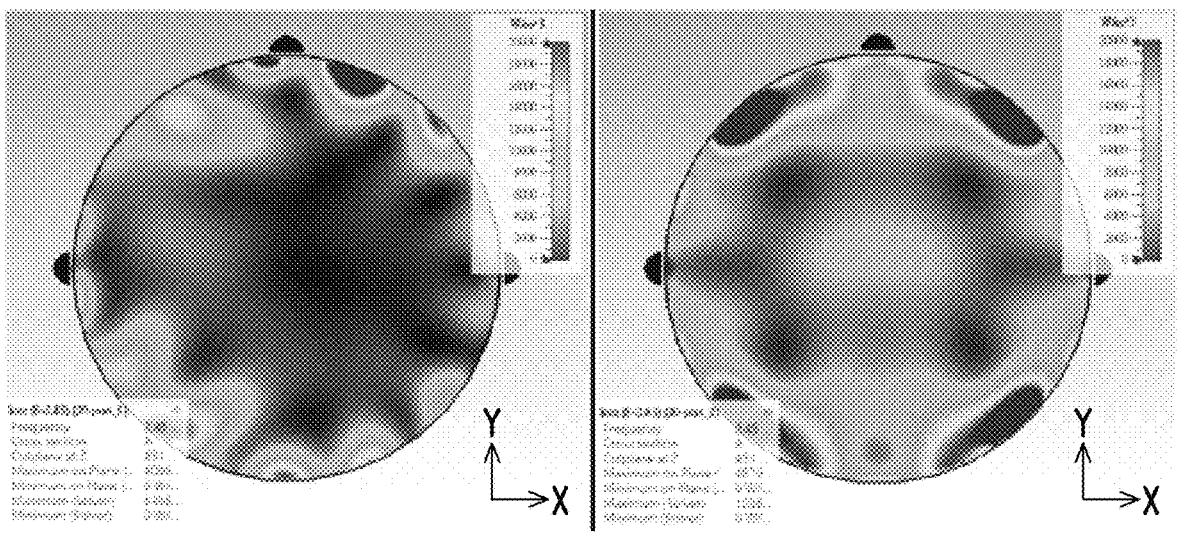
FIG. 3A                    FIG. 3B
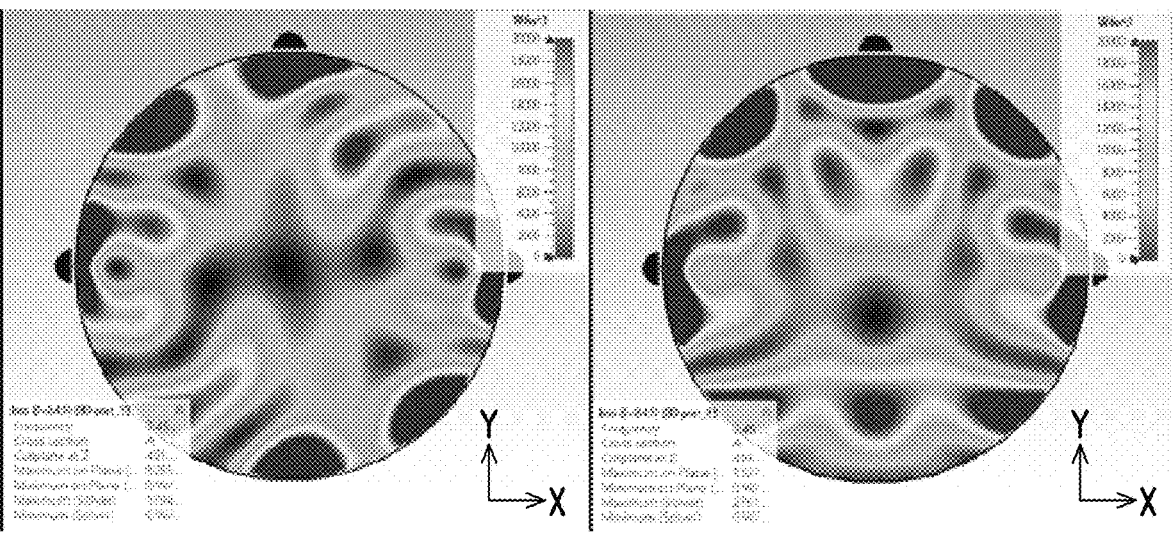
FIG. 3C                    FIG. 3D

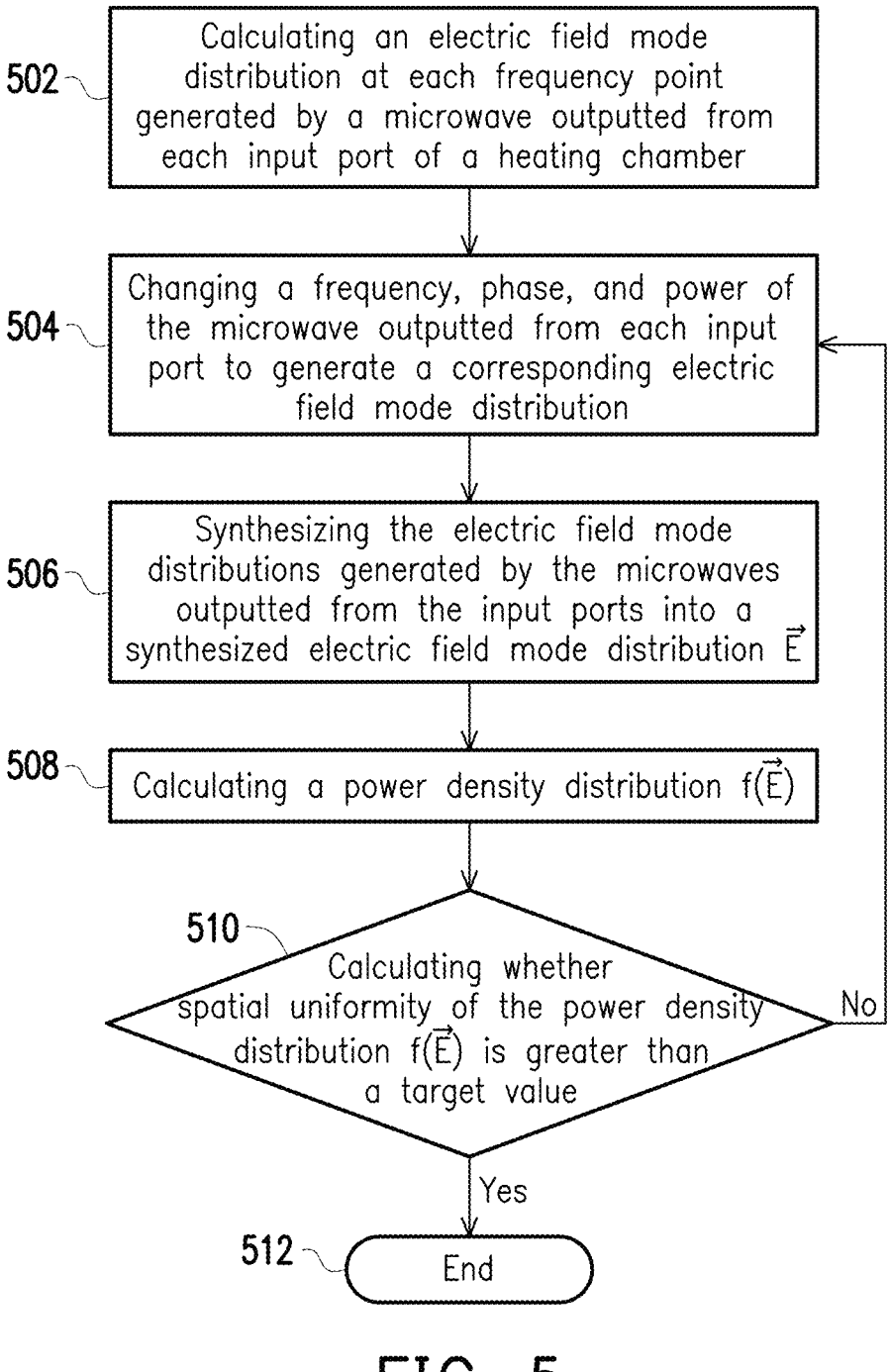

502 — Calculating an electric field mode distribution at each frequency point generated by a microwave outputted from each input port of a heating chamber 504 — Changing a frequency, phase, and power of the microwave outputted from each input port to generate a corresponding electric field mode distribution 506 — Synthesizing the electric field mode distributions generated by the microwaves outputted from the input ports into a synthesized electric field mode distribution $\vec{E}$ 508 — Calculating a power density distribution $f(\vec{E})$ 510 — Calculating whether spatial uniformity of the power density distribution $f(\vec{E})$ is greater than a target value No Yes 512 — End

FIG. 5

MICROWAVE HEATING METHOD AND MICROWAVE HEATING DEVICE

CROSS-REFERENCE TO RELATED APPLICATION

This application claims the priority benefit of U.S. Provisional Application No. 63/179,555, filed on Apr. 26, 2021. The entirety of the above-mentioned patent application is hereby incorporated by reference herein and made a part of this specification.

BACKGROUND

Technical Field

The disclosure relates to a heating method and a heating device, and in particular, relates to a microwave heating method and a microwave heating device.

Description of Related Art

Microwave heating technology has a wide range of applications, such as the drying of wood and grain, rubber vulcanization, and meat thawing, and it may also be used in the annealing process of semiconductor wafers. In the semiconductor manufacturing process, wafer annealing is a necessary procedure after ion implantation. When tetravalent semiconductors are implanted with trivalent or pentavalent elements, high-energy ions may destroy the integrity of the silicon lattice in the semiconductor wafer, causing lattice defects in the silicon lattice and leading to changes in semiconductor properties. Therefore, the wafer after ion implantation must undergo a moderate annealing treatment, and heat energy is used to eliminate the lattice defects and internal stress in the wafer and restore the integrity of the silicon lattice. Further, during the annealing process, the dopant atoms may be diffused to the alternative positions on the silicon lattice, so that the dopant atoms may be effectively activated into the dopant atoms with semiconductor electrical functions. With the gradual reduction of semiconductor line width, dopant atoms may easily diffuse to the depletion region at high temperatures (above 800° C.), causing the semiconductor device to fail. Besides, when silicon germanium materials are used, the annealing temperature is required to be lower than 450° C. to avoid the diffusion of germanium. Therefore, in order to avoid the diffusion of dopant atoms due to high temperatures during annealing, the use of a low-temperature microwave annealing process may allow the yield of the semiconductor process to be improved.

In addition, in some semiconductor manufacturing processes, selective annealing is required to be performed on certain specific elements, compounds, or specific regions in the semiconductor device. In this way, damage caused by high temperatures to other regions that do not need high temperatures and thus lowering the yield of the semiconductor process in the annealing process may be prevented from occurring.

Due to the high penetration of microwaves, the thermal effect and non-thermal effect of the heated object may be achieved to achieve the effect of low-temperature annealing. In addition, regarding microwave heating, a variable-frequency microwave heating method with selectable frequencies may be developed for specific microwave absorption frequencies of different elements or compounds to achieve selective heating. Besides, the microwave phase adjustment and control technology may be used to increase the number of microwave modes, so that the heated object may be uniformly heated.

SUMMARY

The disclosure provides a microwave heating method and a microwave heating device through which a number of microwave modes is increased and uniform microwave heating is achieved by changing a frequency and phase of a microwave.

According to an embodiment of the disclosure, a microwave heating method is provided, and the method is implemented through a microwave heating device. The microwave heating device includes a heating chamber, a carrier, a plurality of microwave transmitters, and a controller. The heating chamber has an accommodating space. The carrier is disposed in the accommodating space and has a flat surface configured for carrying an object to be heated. The microwave transmitters are disposed outside the heating chamber and are configured for generating microwaves. The controller is coupled to the microwave transmitters and is configured for controlling the microwave transmitters, so that each of the microwave transmitters outputs the microwave with a specific frequency, phase, and power. The microwave heating method includes the following steps. In step 1, an electric field mode distribution at each frequency point generated by the microwave outputted from each input port of the heating chamber is calculated. In step 2, the frequency, phase, and power of the microwave outputted from each input port are changed to generate a corresponding electric field mode distribution. In step 3, the electric field mode distributions generated by the input ports are synthesized into a synthesized electric field mode distribution. In step 4, a power density distribution is calculated. The power density distribution refers to a heating power density of the synthesized electric field mode distribution synthesized in step 3 in a heating range of the object to be heated. In step 5, whether spatial uniformity of the power density distribution is greater than a target value is calculated. Step 6 is performed if the spatial uniformity is greater than the target value; otherwise step 1 is performed again. In step 6, the controller heats the object to be heated through the microwave corresponding to the frequency, phase, and power emitted by the microwave transmitter corresponding to each input port.

According to another embodiment of the disclosure, a microwave heating method is provided, and the method is implemented through a microwave heating device. The microwave heating device includes a heating chamber, a carrier, a plurality of microwave transmitters, and a controller. The heating chamber has an accommodating space. The carrier is disposed in the accommodating space and has a flat surface configured for carrying an object to be heated. The microwave transmitters are disposed outside the heating chamber and are configured for generating microwaves. The controller is coupled to the microwave transmitters and is configured for controlling the microwave transmitters, so that each of the microwave transmitters outputs the microwave with a specific frequency, phase, and power. The microwave heating method includes the following steps. In step 1, an electric field mode distribution at each frequency point generated by the microwave outputted from each input port of the heating chamber is calculated. In step 2, the frequency, phase, and power of the microwave outputted from each input port are changed in each of a plurality of time periods to generate a corresponding electric field mode distribution. In step 3, the electric field mode distributions generated by the microwaves outputted from the input ports in the time periods are synthesized into synthesized electric field mode distributions corresponding to the time periods. In step 4, the power density distributions in the time periods are calculated and added up, and a total power density distribution is calculated. In step 5, whether spatial uniformity of the total power density distribution is greater than a target value is calculated. Step 6 is performed if the spatial uniformity is greater than the target value; otherwise step 1 is performed again. In step 6, the controller heats the object to be heated in stages through the microwave corresponding to the frequency, phase, and power emitted by the microwave transmitter corresponding to each input port in each of the time periods.

According to still another embodiment of the disclosure, a microwave heating device including a heating chamber, a carrier, a plurality of microwave transmitters, and a controller is provided. The heating chamber has an accommodating space. The carrier is disposed in the accommodating space and has a flat surface configured for carrying an object to be heated. The microwave transmitters are disposed outside the heating chamber and are configured for generating microwaves. The controller is coupled to the microwave transmitters and is configured for controlling the microwave transmitters, so that each of the microwave transmitters outputs the microwave with a specific frequency, phase, and power. The microwave outputted by each of the microwave transmitters generate an electric field mode distribution on the object to be heated in the heating chamber. Spatial uniformity of a heating power density generated by the electric field mode distribution within a heating range of the object to be heated is greater than a target value.

To sum up, in the microwave heating method and the microwave heating device provided by the disclosure, the microwave frequency, phase, and power may be selected to increase the number of microwave modes, and numerical simulation analysis may be integrated to achieve improved uniformity of microwave heating.

BRIEF DESCRIPTION OF THE DRAWINGS

FIGS. 3A, 3B, 3C, and 3D are charts of electric field mode distributions generated according to an embodiment of the disclosure.

FIG. 5 is a flow chart of a microwave heating method according to an embodiment of the disclosure.

DESCRIPTION OF THE EMBODIMENTS

Figure 1:
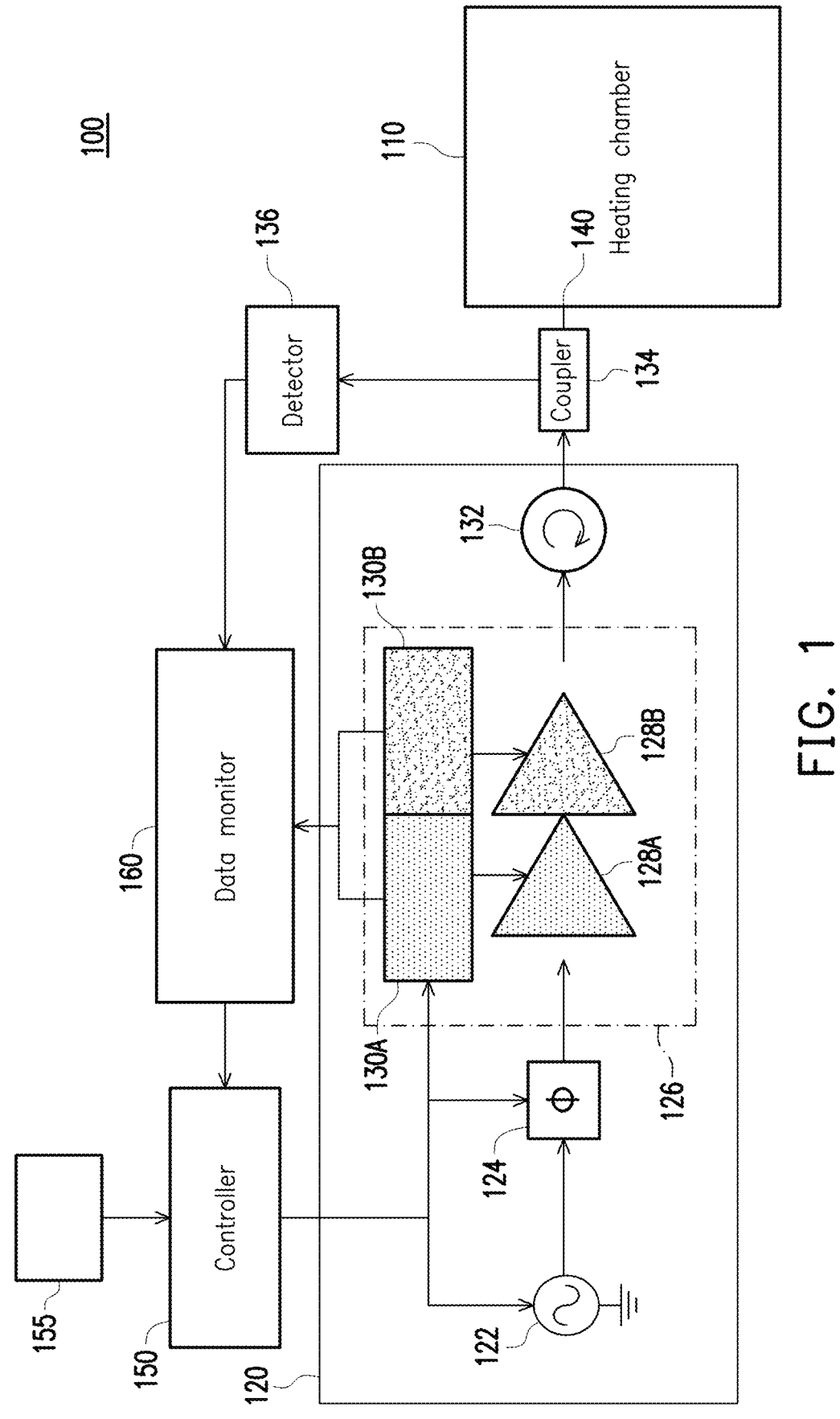
FIG. 1 is a schematic diagram of a microwave heating device according to an embodiment of the disclosure.

The disclosure may be fully understood with reference to the following embodiments and accompanying drawings.

However, it is noted that the disclosure may still be implemented in many other different forms and should not be construed as limited to the embodiments described hereinafter. In the drawings, for the sake of clarity, the members and their relative dimensions may not be drawn according to actual scale.

FIG. 1 is a schematic diagram of a microwave heating device according to an embodiment of the disclosure. A microwave heating device 100 includes a heating chamber 110, a microwave transmitter 120, a controller 150, and a data monitor 160.

The heating chamber 110 is a hollow chamber. The heating chamber 110 is provided with an accommodating space and is provided with a carrier configured to carry an object to be heated. The heating chamber has a plurality of input ports 140 configured to input microwaves for heating. According to some embodiments, a shape of the heating chamber 110 may be a cylinder, but it is not limited thereto.

A plurality of microwave transmitters 120 are disposed outside the heating chamber 110 (only one microwave transmitter 120 is shown in FIG. 1). The microwave transmitter 120 is connected to the controller 150 to receive a command issued by the controller 150, so as to control a frequency, phase, and amplitude of the microwave outputted by the microwave transmitter 120. The microwave transmitter 120 and the heating chamber 110 are further connected to the data monitor 160 through a detector 136 via a coupler 134, so that the data monitor 160 may monitor output power of the microwave transmitter 120 and reflected power of the heating chamber 110 through feedback of the coupler 134 and the detector 136.

Each microwave transmitter 120 includes a microwave generator 122, a phase shifter 124, a power amplifier module 126, and a ring isolator 132.

The microwave generator 122 is connected to the controller 150 to receive the command issued by the controller 150, so as to emit a microwave of a specific frequency. According to some embodiments, the microwave frequency range of the microwave generated by the microwave generator 122 is 2 GHz to 4 GHz, but it is not limited thereto. According to some embodiments, the power of the microwave generator 122 is 3.2 mW, but it is not limited thereto.

The microwave generated by the microwave generator 122 may be inputted to the phase shifter 124. The phase shifter 124 is additionally connected to the controller 150 to receive the command issued by the controller 150, so that the phase shifter 124 may change the phase of the microwave generated by the microwave generator 122. In this way, the microwave inputted from the microwave transmitter 120 to the heating chamber 110 may be switched among a plurality of phases, so as to generate standing wave patterns corresponding to different phase permutations and combinations in the heating chamber 110. According to some embodiments, the phase shifter 124 is a 6-bit digital phase shifter and may generate 64 different phase combinations, or equivalent to a phase change of 5.625 degrees, but it is not limited thereto.

The microwave outputted from the phase shifter 124 is inputted to the power amplifier module 126. The power amplifier module 126 is connected to the controller 150 to receive the command issued by the controller 150, so that the power amplifier module 126 may amplify the power of the microwave generated by the microwave generator 122. In this way, the microwave inputted from the microwave transmitter 120 to the heating chamber 110 may be adjusted to a power suitable for a specific microwave heating method and may be switched among multiple powers to generate standing wave patterns with different power permutations and combinations in the heating chamber 110. According to some embodiments, the solid-state power amplifier 126 is a two-stage amplifier, which amplifies microwave power in a two-stage amplification manner. According to other embodiments, the solid-state power amplifier 126 may also be a three-stage amplifier, but the disclosure is not limited thereto.

The power amplifier module 126 includes power amplifiers 128A and 128B and bias circuits 130A and 130B. According to some embodiments, a number of power amplifiers is equal to a number of bias circuits. In FIG. 1, in the power amplifier module 126, the number of power amplifiers and the number of bias circuits are both two, which means that the number of power amplification stages is a two-stage series connection. According to some embodiments, the number of power amplifiers and the number of bias circuits may be greater than or equal to two groups, which means that the number of power amplification stages may be greater than or equal to two. The bias circuits 130A and 130B are connected to the controller 150 to receive the command issued by the controller 150 and accordingly control the bias voltages of the power amplifiers 128A and 128B, and then the microwave generated by the microwave generator 122 is amplified in two stages. According to some embodiments, the bias circuit 130A controls the amplification power of the power amplifier 128A, and the bias circuit 130B controls the amplification power of the power amplifier 128B. The bias circuits 130A and 130B are additionally connected to the data monitor 160, so that the data monitor 160 may measure the bias voltages of the bias circuits 130A and 130B.

When the microwave is inputted from the phase shifter 124 to the power amplifiers 128A and 128B of the power amplifier module 126, the power amplifiers 128A and 128B sequentially amplify the power of the microwave inputted from the phase shifter 124 in a two-stage sequence. According to some embodiments, each of the power amplifiers 128A and 128B is a gallium nitride solid-state power amplifier, but it is not limited thereto. According to some embodiments, each of the power amplifiers 128A and 128B may amplify the microwave with a power of 3.2 mW generated by the microwave generator 122 to a maximum output power of 100 W or other suitable power, but it is not limited thereto.

The microwave outputted from the power amplifier module 126 may be inputted to the ring isolator 132. The ring isolator 132 is configured to isolate a microwave signal reflected from the heating chamber 110 and may protect the power amplifier module 126 from a reflected signal from directly entering and damaging the power amplifier module 126. With the ring isolator 132 isolating the reflected signal, the microwave amplified by the power amplifier module 126 may only be transmitted to the coupler 134 and the heating chamber 110 in one direction.

After the microwaves outputted by the microwave transmitters 120 are transmitted to the coupler 134, the coupler 134 may input part of the microwaves to the heating chamber 110 through the input ports 140 to heat a sample to be heated in the heating chamber 110. The other part of the microwaves outputted by the microwave transmitters 120 and the microwaves reflected by the heating chamber 110 are inputted to the detector 136 through the coupler 134, so as to detect the phases and powers of the microwaves outputted by the microwave transmitters 120 and the microwaves reflected by the heating chamber 110. The phases and powers of the microwaves outputted by the microwave transmitters 120 and the microwaves reflected by the heating chamber 110 detected by the detector 136 are inputted to the data monitor 160.

The controller 150 is connected to both the microwave transmitters 120 and the data monitor 160. The controller 150 controls the frequencies, phases, and amplitudes of the microwaves outputted from the microwave transmitters 120 according to power transmission of the microwave transmitters 120 inputted by the data monitor 160, the phases and power states of the microwaves reflected by the heating chamber 110, and a command inputted by a computer 155. According to some embodiments, the controller 150 may be a microprocessor, but it is not limited thereto.

The data monitor 160 is connected to the microwave transmitters 120, the detector 136, and the controller 150. The data monitor 160 may measure operating bias voltages of the microwave transmitters 120 to determine whether an operating state of the microwave transmitters 120 is consistent with expectation. On the other hand, the data monitor 160 may know the phases and powers of the microwaves emitted by the microwave transmitters 120 and the microwaves reflected by the heating chamber 110 by reading an analysis result of the microwaves outputted by the microwave transmitters 120 and the microwaves reflected by the heating chamber 110 by the detector 136. In this way, the data monitor 160 may determine whether the power transmission of the microwave transmitters 120 and the phases and power states of the microwaves reflected by the heating chambers 110 are consistent with expectation. According to some embodiments, the data monitor 160 may be an independent processor or may be integrated with the controller 150 into the same processor, but it is not limited thereto.

Figure 2A:
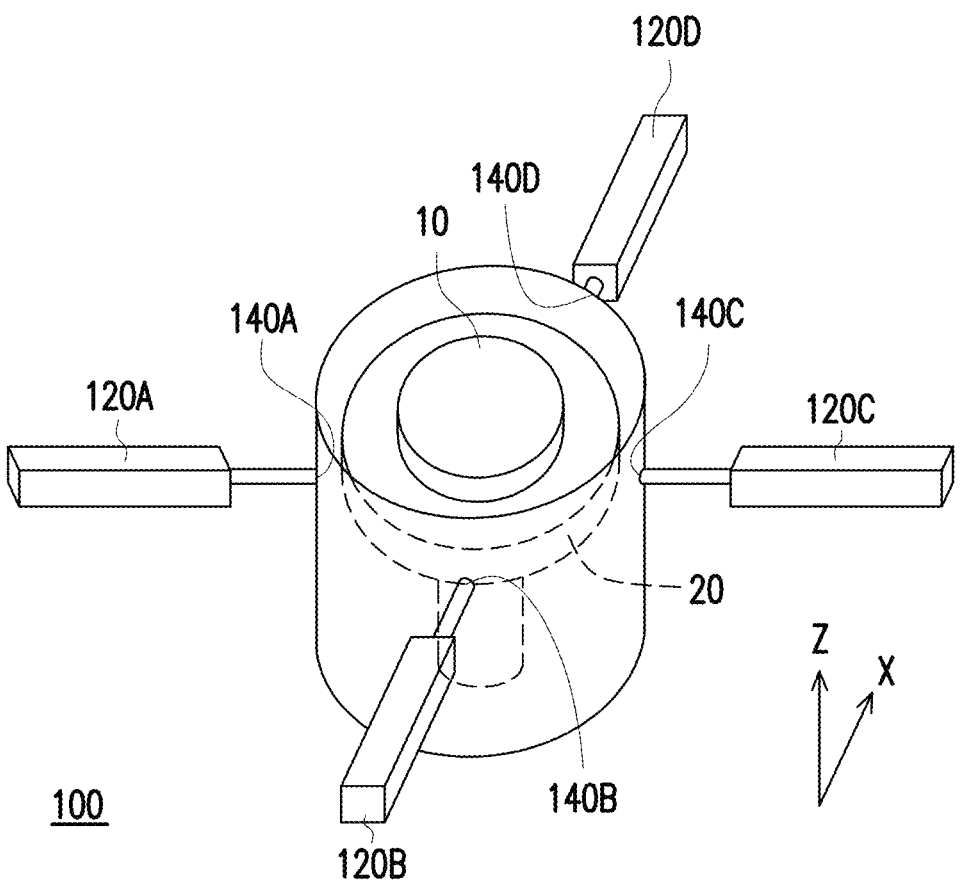
FIG. 2A is a three-dimensional view of a heating chamber of the microwave heating device according to an embodiment of the disclosure.
Figure 2B:
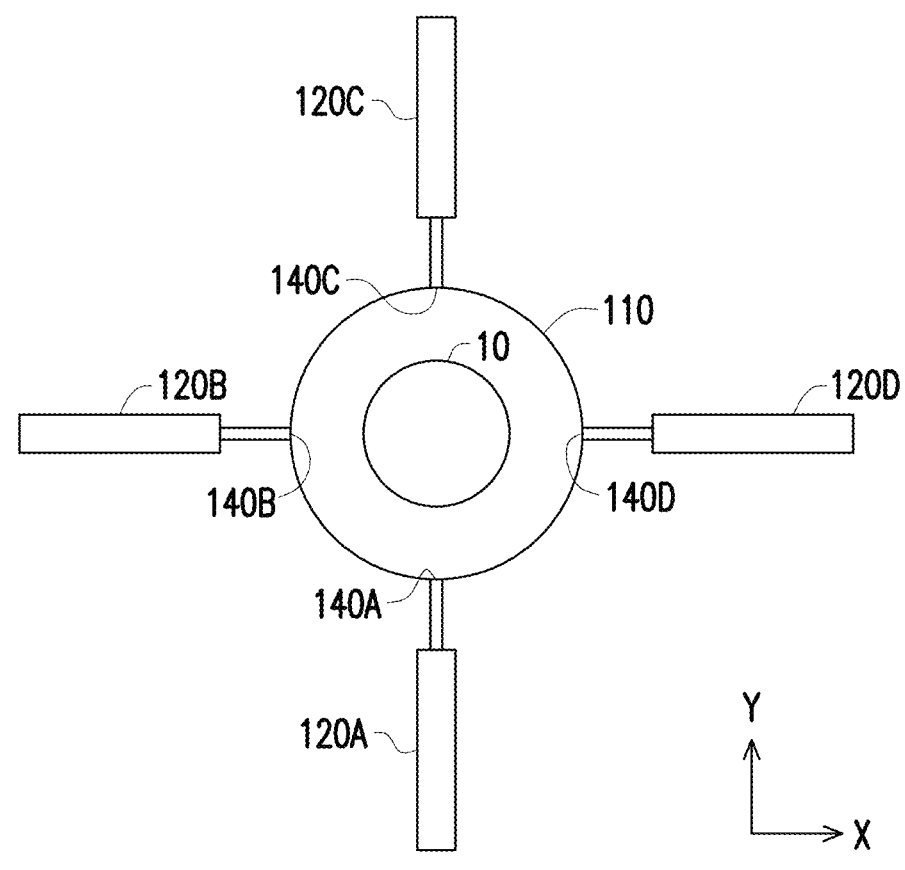
FIG. 2B is a top view of the heating chamber of the microwave heating device according to an embodiment of the disclosure.
Figure 2C:
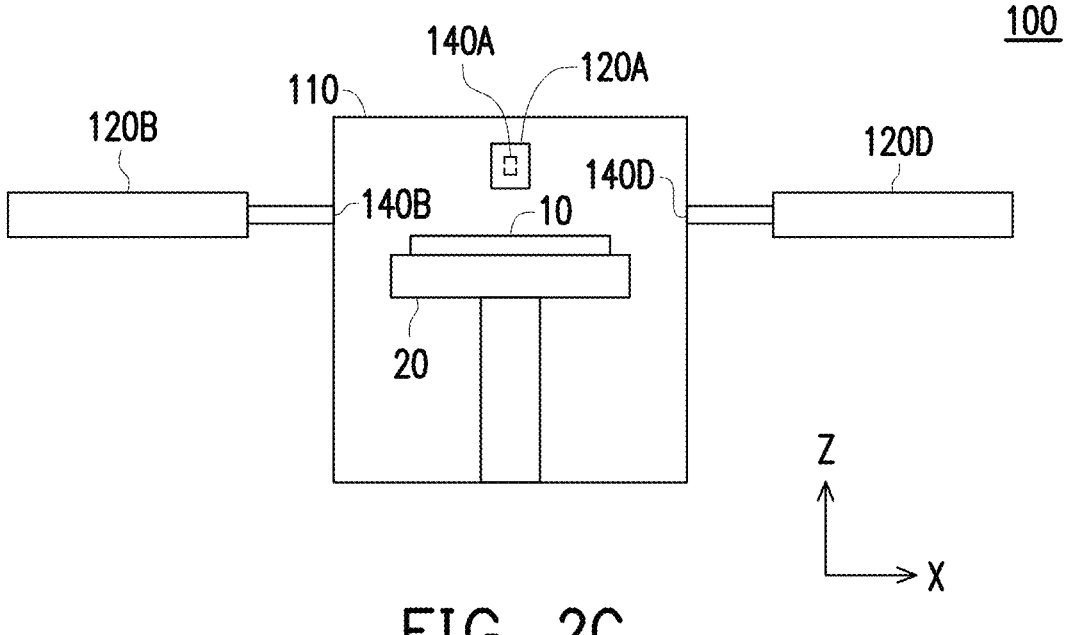
FIG. 2C is a side view of the heating chamber of the microwave heating device according to an embodiment of the disclosure.

FIGS. 2A, 2B, and 2C respectively are a three-dimensional view, a top view, and a side view of the heating chamber 110 of the microwave heating device 100 according to an embodiment of the disclosure. As shown in FIGS. 2A, 2B, and 2C, the heating chamber 110 has a carrier 20 disposed in the heating chamber 110 to carry an object to be heated 10. According to some embodiments, the carrier 20 is a fixed carrier. During a microwave heating process, a position of the carrier 20 is fixed, that is, the carrier 20 is not rotated or a height of the carrier 20 is not raised or lowered during the microwave heating process. By combining the microwaves inputted to the heating chamber 110 from the input ports, a uniform heating power density may be generated for the object to be heated 10. Therefore, it is not necessary to uniformly heat the object to be heated 10 by means of a rotating carrier or a lifting carrier.

A plurality of microwave transmitters 120A, 120B, 120C, and 120D are arranged outside the heating chamber 110, individually outputting microwaves, and the microwaves are then inputted to the input ports 140A, 140B, 140C, and 140D of the heating chamber 110 through an input coupler (not shown). The microwave transmitter 120C and the input port 140C are not shown in FIG. 2C due to the viewing angle. For ease of description and simplification of the drawings, only four microwave transmitters 120A, 120B, 120C, and 120D are shown herein, but a number of microwave transmitters is not limited thereto. When the number of microwave transmitters increases, uniform microwave heating may be easily generated. According to some embodiments, the number of microwave transmitters may be an integer greater than or equal to 2. According to some embodiments, the number of microwave transmitters may be greater than 10.

The structures of the microwave transmitters 120A, 120B, 120C, and 120D are as shown in the structure of the microwave transmitter 120 in FIG. 1, and input ports 140A, 140B, 140C, and 140D are the input ports 140 in FIG. 1, so description thereof is not repeated herein. The microwave transmitters 120A, 120B, 120C, and 120D are individually connected to the controller 150 (not shown) and the data monitor 160 (not shown). The controller 150 independently controls the microwave transmitters 120A, 120B, 120C, and 120D, so that the microwave transmitters 120A, 120B, 120C, and 120D may individually generate microwaves of different frequencies, phases, and powers.

As shown in FIGS. 2A, 2B, and 2C, according to some embodiments, in the top view of the heating chamber 110, the input ports 140A, 140B, 140C, and 140D corresponding to the microwave transmitters 120A, 120B, 120C, and 120D respectively surround a side wall of the heating chamber 110 in sequence. According to some embodiments, the input ports 140A, 140B, 140C, and 140D may be distributed at any position on the side wall of the heating chamber 110. According to some other embodiments, the input ports 140A, 140B, 140C, and 140D may be distributed at any position on an upper wall of the heating chamber 110. According to some embodiments, the input ports 140A, 140B, 140C, and 140D may surround the heating chamber 110 and are distributed at equal distances. According to some other embodiments, the input ports 140A, 140B, 140C, and 140D may surround the heating chamber 110 and are distributed at unequal distances. According to some embodiments, part or all of the microwave transmitters 120A, 120B, 120C, and 120D may be located at a same height. According to some embodiments, part or all of the microwave transmitters 120A, 120B, 120C, and 120D may be located at an upper cover of the heating chamber. It should be noted that only four microwave transmitters are shown herein for illustration, but it is not limited thereto. According to some embodiments, a number of input ports is the same as the number of microwave transmitters. According to some other embodiments, the number of input ports is greater than or equal to the number of microwave transmitters.

FIGS. 3A, 3B, 3C, and 3D respectively are charts of electric field mode distributions generated on the plane of the object to be heated 10, that is, on the XY plane, after the microwaves outputted by the microwave transmitters 120A, 120B, 120C, and 120D are inputted into the heating chamber 110 through the input ports 140A, 140B, 140C, and 140D. The charts of electric field mode distributions shown in FIGS. 3A, 3B, 3C, and 3D are calculated and obtained by numerical methods based on the frequencies, phases, and powers of the inputted microwaves, the positions of the input ports, and the material and spatial distributions of the heating chamber 110. Changes in the frequencies, phases, powers of the microwave transmitters and positions of the input ports may cause changes in the charts of electric field mode distributions.

According to some embodiments, in the charts of electric field mode distributions shown in FIGS. 3A, 3B, 3C, and 3D, the microwaves outputted by the microwave transmitters 120A, 120B, 120C, and 120D have the same frequency, the same phase, and the same power. The phases of the microwaves outputted by the microwave transmitters 120A, 120B, 120C, and 120D are all zero. The differences in the charts of electric field mode distributions shown in FIGS. 3A, 3B, 3C, and 3D are related to the positions of the input ports 140A, 140B, 140C, and 140D, an internal shape of the heating chamber 110, and the frequencies of the microwaves.

Figure 4A:
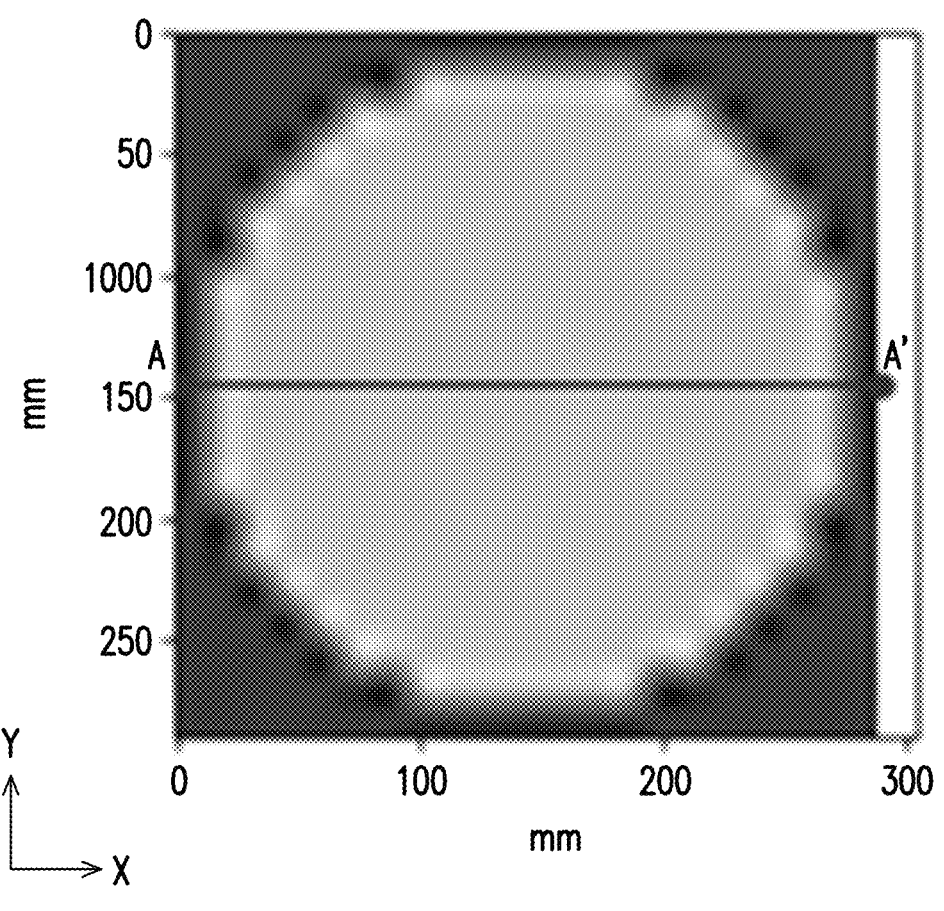
FIG. 4A is a chart of an electric field mode distribution according to an embodiment of the disclosure.
Figure 4B:
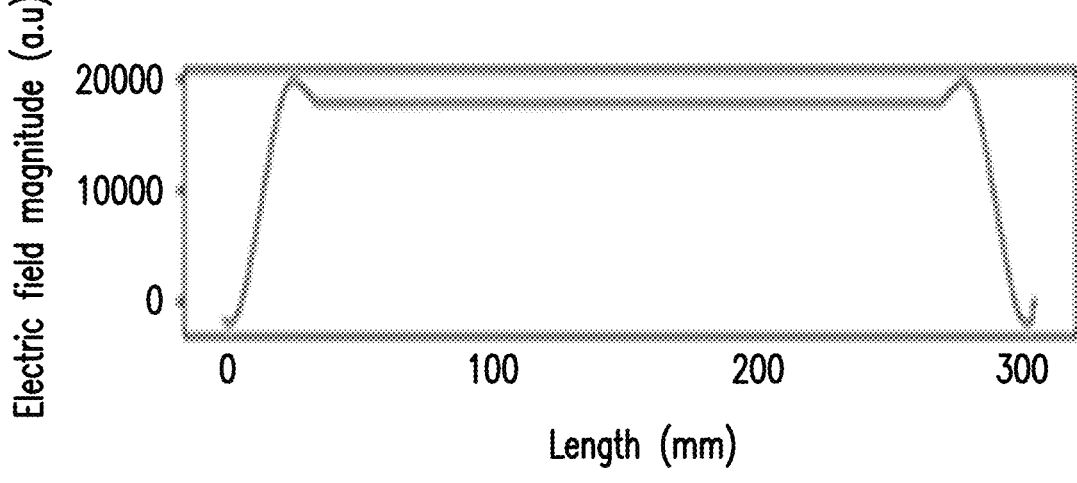
FIG. 4B is a cross-sectional view of an electric field mode distribution of the chart of the electric field mode distribution of FIG. 4A taken along a line AA'.

FIG. 4A is a chart of an electric field mode distribution on a surface of the object to be heated 10 after the charts of electric field mode distributions of the input ports 140A, 140B, 140C, and 140D are superimposed. FIG. 4B is a cross-sectional view of an electric field mode distribution of the chart of the electric field mode distribution of FIG. 4A taken along a line AA'. The controller 150 controls output frequencies of the microwave transmitters 120A, 120B, 120C, and 120D to be the same frequency and respectively controls the phases and powers of the microwaves outputted by the microwave transmitters 120A, 120B, 120C, and 120D to change the electric field mode distributions generated by the microwave transmitters 120A, 120B, 120C, and 120D. After the output phases and output powers of the microwave transmitters 120A, 120B, 120C, and 120D are optimized, the microwave transmitters 120A, 120B, 120C, and 120D output microwaves to the input ports 140A, 140B, 140C, and 140D of the heating chamber 110 with optimized output phases and output powers, so that the electric field mode distributions corresponding to the output frequencies, output phases, and output powers of the individual microwave transmitters are generated, and these electric field mode distributions are superimposed to obtain the chart of the electric field mode distribution shown in FIG. 4A.

According to some embodiments, the object to be heated may be a 12-inch wafer. The superimposed electric field mode has a uniform distribution in FIG. 4A. FIG. 4B is a cross-sectional view taken along the line AA' of FIG. 4A. As shown in FIG. 4B, the electric field mode distribution is uniformly distributed at a position of approximately 30-270 mm, so the object to be heated may be uniformly heated.

FIG. 5 is a flow chart of a microwave heating method according to an embodiment of the disclosure. With reference to the microwave heating device 100 shown in FIG. 1, FIG. 2A, and FIG. 2B together, in step 502, an electric field mode distribution at each frequency point generated by the microwave outputted from each input port of the heating chamber is calculated. According to some embodiments, the electric field mode distribution generated at each frequency point of the microwave outputted from each input port 140A, 140B, 140C, and 140D in the heating chamber 110 is calculated, as shown in FIGS. 3A, 3B, 3C, and 3D. Herein, the power of each microwave transmitter 120A, 120B, 120C, and 120D is set to be the same, and the phase of each microwave transmitter 120A, 120B, 120C, and 120D is set to zero. The electric field mode distribution generated by each input port for each frequency is treated as the initial electric field mode distribution. According to some embodiments, the phase of the initial electric field mode distribution may not be zero.

In step 504, the frequency, phase, and power of the microwave outputted from each input port is changed to generate a corresponding electric field mode distribution. According to some embodiments, a system changes the frequency, phase, and power of the microwave outputted from each input port to calculate the corresponding electric field mode distribution. According to some embodiments, the microwave frequency ranges from 2 GHz to 4 GHz, but it is not limited thereto. According to some embodiments, there are 64 different phases in the phase range, but it is not limited thereto. According to some embodiments, the power range is 3.2 mW to 100 W, but it is not limited thereto. The system changes the frequency, phase, and power of the microwave outputted by each input port 140A, 140B, 140C, and 140D and calculates the corresponding electric field mode distribution generated by each input port on the surface of the object to be heated according to the changed frequency, phase, and power. According to other embodiments, the system determines the microwave frequency according to the material of the object to be heated 10. For instance, if the object to be heated is a silicon wafer, since silicon absorbs microwaves at 2.7 GHz, the microwave frequency may be selected and fixed at 2.5 GHz or 3.0 GHz. If the object to be heated is a silicon wafer doped with N-type or P-type heterogeneous elements, the microwave frequency may be selected and fixed at 4.0 GHz because the absorption frequency of the doped atom type is 3.8 GHz or 3.9 GHz, but it is not limited thereto. After the microwave frequency is determined, the system changes the phase and power of the microwave outputted by each input port 140A, 140B, 140C, and 140D and calculates the corresponding electric field mode distribution generated by each input port on the surface of the object to be heated according to the changed phase and power.

In step 506, the electric field mode distributions generated by the input ports are synthesized into a synthesized electric field mode distribution $\vec{E}$ (also referred to as electric field $\vec{E}$). According to some embodiments, the electric field mode distributions generated by the microwaves outputted from the input ports 140A, 140B, 140C, and 140D are synthesized into a synthesized electric field mode distribution.

In step 508, a power density distribution $f(\vec{E})$ is calculated. The power density distribution $f(\vec{E})$ is a function to represent the electric field magnitude distribution on the surface of the object to be heated in the heating chamber. The power density distribution $f(\vec{E})$ refers to the heating power density of the electric field $\vec{E}$ synthesized in step 506 within a heating range of the object to be heated. The heating power density is related to the electric field $\vec{E}$ and the material of the object to be heated 10.

In step 510, it is calculated whether spatial uniformity of the power density distribution $f(\vec{E})$ is greater than a target value. Spatial uniformity refers to the spatial uniformity of power density distribution $f(\vec{E})$, which may be defined according to process needs. In this embodiment, the target value of the spatial uniformity may be defined as: (1−std/mean)*100%, where std is a standard deviation of the power density distribution $f(\vec{E})$, and mean is an average value of the power density distribution $f(\vec{E})$. For instance, the spatial uniformity of the power density distribution $f(\vec{E})$ is 99%, which means that the value of the standard deviation of the power density distribution $f(\vec{E})$ is within the 1% variation range of the average value of the power density distribution $f(\vec{E})$. According to some embodiments, for example, based on factors such as process yield requirements or energy saving, the target value is set to 95% or 99%, but it is not limited thereto.

If the spatial uniformity is greater than the target value, step 512 is continuously performed. It is no longer required to find the microwave input combination of each input port, and the controller 150 heats the object to be heated 10 through the microwave corresponding to the frequency, phase, and power emitted by the microwave transmitter corresponding to each input port.

If the spatial uniformity is lower than the target value, step 504 is performed again. The frequency, phase, and power of the microwave outputted from each input port are changed again, and the above steps are repeated until the spatial uniformity is greater than the target value.

In the microwave heating method shown in FIG. 5, an electric field may be combined by adjusting the frequency, phase, and power of the microwaves of each input port, so that the electric field has a heating power density with high spatial uniformity in the heating range. Therefore, the object to be heated may be heated uniformly. After the microwave state of each input port is determined, the object to be heated is heated with the determined frequency, phase, and power to directly heat it to the required heating state. In this method, only the electric field mode distribution generated by each input port needs to be calculated, without considering the change of the electric field mode over time. Therefore, the microwave heating method shown in FIG. 5 is also called a microwave heating method performed by field coupling of a single period of electromagnetic field.

Besides, in the microwave heating method shown in FIG. 5, from step 504 to step 510, the frequency, phase, and power of the microwave of each input port are required to be repeatedly changed to generate the corresponding electric field mode distribution and to couple them to find the most appropriate combination of parameters. In the finding process, the material and heating range of the object to be heated need to be considered as well. Therefore, this process requires a considerable amount of calculation.

When the object to be heated has multiple structures, when different regions of the object to be heated have different heating requirements, for example, the semiconductor silicon wafer and the high-dielectric constant film grown on the semiconductor silicon wafer are required be heated separately, or when a greater/lower heating power density is required for a portion of the object to be heated, microwave heating may be performed on the object to be heated in stages. In this way, heating may be completed more efficiently in response to the needs of different regions of the object to be heated. When staged microwave heating is performed, the heat generated after each stage of heating may accumulate in the heated area. Therefore, heat may be accumulated in each region in stages to achieve the final heating effect.

Figure 6:
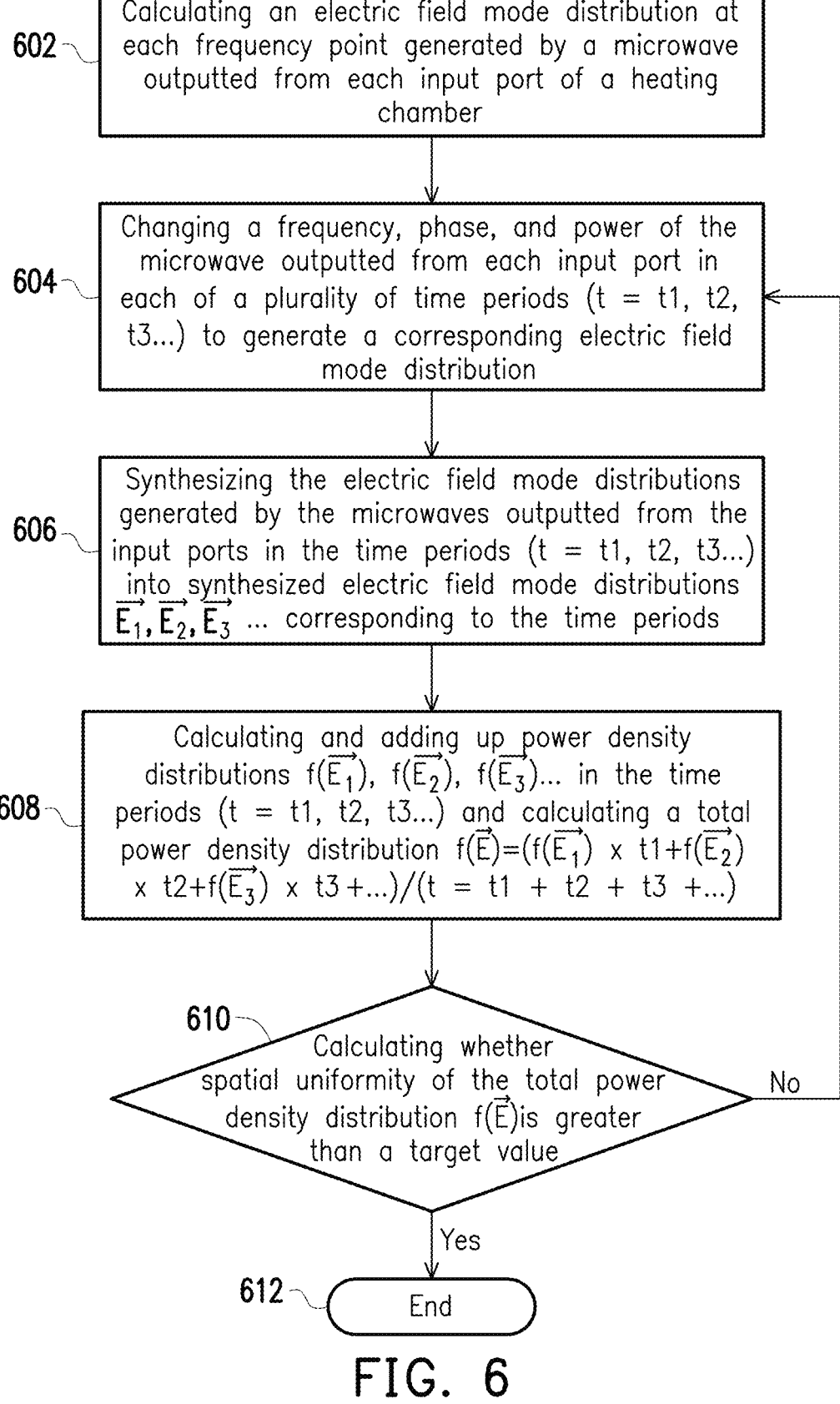
FIG. 6 is a flow chart of another microwave heating method according to an embodiment of the disclosure.

FIG. 6 is a flow chart of another microwave heating method according to an embodiment of the disclosure. With reference to the microwave heating device 100 shown in FIG. 1, FIG. 2A, and FIG. 2B together, in step 602, an electric field mode distribution at each frequency point generated by the microwave outputted from each input port of the heating chamber is calculated. According to some embodiments, the electric field mode distribution generated at each frequency point of the microwave outputted from each input port 140A, 140B, 140C, and 140D in the heating chamber 110 is calculated, as shown in FIGS. 3A, 3B, 3C, and 3D. Herein, the power of each microwave transmitter 120A, 120B, 120C, and 120D is set to be the same, and the phase of each microwave transmitter 120A, 120B, 120C, and 120D is set to zero. The electric field mode distribution generated by each input port for each frequency is treated as the initial electric field mode distribution. According to some embodiments, the phase of the initial electric field mode distribution may not be zero.

In step 604, in each of a plurality of time periods (t=t1, t2, t3 . . . ), the frequency, phase, and power of the microwave outputted from each input port are changed to generate a corresponding electric field mode distribution. According to some embodiments, the system changes the frequency, phase, and power of the microwave outputted from each input port to calculate the corresponding electric field mode distribution. According to some embodiments, lengths of time of the time periods may not be equal. According to some embodiments, the microwave frequency ranges from 2 GHz to 4 GHz, but it is not limited thereto. According to some embodiments, there are 64 different phases in the phase range, but it is not limited thereto. According to some embodiments, the power range is 3.2 mW to 100 W, but it is not limited thereto. The system changes the frequency, phase, and power of the microwave outputted by each input port 140A, 140B, 140C, and 140D and calculates the corresponding electric field mode distribution generated by each input port on the surface of the object to be heated according to the changed frequency, phase, and power.

In step 606, in the time periods (t=t1, t2, t3 . . . ), the electric field mode distributions generated by the microwaves outputted from the input ports are synthesized into synthesized electric field mode distributions $\vec{E}_1$, $\vec{E}_2$, $\vec{E}_3$ . . . (also referred to as electric field $\vec{E}_1$, $\vec{E}_2$, $\vec{E}_3$ . . . ) corresponding to the time periods. According to some embodiments, the synthesized electric field mode distributions generated by the microwaves outputted from the input ports 140A, 140B, 140C, and 140D in the time periods (t=t1, t2, t3 . . . ) are synthesized into a synthesized electric field mode distribution.

In step 608, the power density distributions $f(\vec{E}_1)$, $f(\vec{E}_2)$, $f(\vec{E}_3)$ . . . in the time periods (t=t1, t2, t3 . . . ) are calculated and added up, and a total power density distribution $f(\vec{E})=(f(\vec{E}_1)\times t1+f(\vec{E}_2)\times t2+f(\vec{E}_3)\times t3+ . . . )/(t1+t2+t3+ . . . )$ of the time periods (t=t1, t2, t3 . . . ) is calculated. The power density distributions $f(\vec{E}_1)$, $f(\vec{E}_2)$, $f(\vec{E}_3)$. refer to the heating power densities of the electric fields $\vec{E}_1$, $\vec{E}_2$, $\vec{E}_3$ . . . synthesized in step 606 in the time periods (t=t1, t2, t3 . . . ) within the heating range of the object to be heated. The heating power densities are related to the electric fields $\vec{E}_1$, $\vec{E}_2$, $\vec{E}_3$ . . . and the material of the object to be heated 10. According to some embodiments, the power density distributions $f(\vec{E}_1)$, $f(\vec{E}_2)$, $f(\vec{E}_3)$ . . . in the time periods (t=t1, t2, t3 . . . ) are different from each other.

In step 610, it is calculated whether the spatial uniformity of the total power density distribution $f(\vec{E})$ is greater than a target value. Spatial uniformity refers to the spatial uniformity of the total power density distribution $f(\vec{E})$, which may be defined according to process needs. In this embodiment, the target value of the spatial uniformity may be defined as: (1−std/mean)*100%, where std is the standard deviation of the total power density distribution $f(\vec{E})$, and mean is the average value of the total power density distribution $f(\vec{E})$. For instance, the spatial uniformity of the total power density distribution $f(\vec{E})$ is 99%, which means that the value of the standard deviation of the total power density distribution $f(\vec{E})$ is within the 1% variation range of the average value of the total power density distribution $f(\vec{E})$. According to some embodiments, for example, based on factors such as process yield requirements or energy saving, the target value is set to 95% or 99%, but it is not limited thereto.

If the spatial uniformity is greater than the target value, step 612 is continuously performed. It is no longer required to find the microwave input combination of each input port, and the controller 150 heats the object to be heated 10 through the microwave corresponding to the frequency, phase, and power emitted by the microwave transmitter corresponding to each input port in the time periods (t=t1, t2, t3 . . . ).

In the microwave heating method shown in FIG. 6, by adjusting the frequency, phase, and power of the microwave of each input port in each of the time periods, different regions of the object to be heated may be heated in stages, and in this way, the heating power density has high spatial uniformity in the heating range during the overall heating process. Therefore, the object to be heated may be heated uniformly.

Besides, in the microwave heating method shown in FIG. 6, same as steps 504 to 510 in FIG. 5, from step 604 to step 610, the frequency, phase, and power of the microwave of each input port need to be changed repeatedly, and the electric field excited by each input port is coupled accordingly to generate the corresponding electric field mode distribution. According to the optimization goal, the algorithm may find the most appropriate combination of frequency, phase, and power for each input port.

In view of the foregoing, in the variable-frequency microwave technology and numerical analysis method provided by disclosure, microwave heating exhibiting selective heating and uniform heating may be achieved, and microwave heating costs may be effectively reduced.

What is claimed is:

1. A microwave heating method, implemented through a microwave heating device, wherein the microwave heating device comprises:

a heating chamber, having an accommodating space; a carrier, disposed in the accommodating space and having a flat surface configured for carrying an object to be heated; a plurality of microwave transmitters, disposed outside the heating chamber and configured for generating microwaves; and a controller, coupled to the microwave transmitters and configured for controlling the microwave transmitters so that each of the microwave transmitters outputs the microwave with a specific frequency, phase, and power, and the microwave heating method comprises:

step 1: calculating an electric field mode distribution at each frequency point generated by the microwave to be outputted from each input port of the heating chamber;

step 2: changing the frequency, phase, and power of the microwave to be outputted from each input port to generate a corresponding electric field mode distribution of each of the input port;

step 3: synthesizing the electric field mode distributions to be outputted by the input ports calculated in step 2 into a synthesized electric field mode distribution;

step 4: calculating a power density distribution, wherein the power density distribution refers to a heating power density of the synthesized electric field mode distribution calculated in step 3 in a heating range of the object to be heated;

step 5: calculating whether spatial uniformity of the power density distribution calculated in step 4 is greater than a target value, wherein step 6 is performed if the spatial uniformity is greater than the target value; otherwise step 1 is performed again; and step 6: heating, by the controller, the object to be heated through the microwave corresponding to the frequency, phase, and power emitted by the microwave transmitter corresponding to each input port predetermined in step 1 to step 5.

2. The method according to claim 1, wherein in step 1, the frequency of the microwave outputted from each input port is fixed to a same frequency.

3. The method according to claim 1, wherein in step 1, the frequency of the microwave outputted from each input port ranges from 2 GHz to 4 GHz.

4. The method according to claim 1, wherein a range of the phase of the microwave outputted from each input port is 64 phases.

5. The method according to claim 1, wherein the target value of the spatial uniformity is defined as: (1−std/mean) *100%, where std is a standard deviation of the power density distribution, and mean is an average value of the power density distribution.

6. A microwave heating method, implemented through a microwave heating device, wherein the microwave heating device comprises:

a heating chamber, having an accommodating space; a carrier, disposed in the accommodating space and having a flat surface configured for carrying an object to be heated; a plurality of microwave transmitters, disposed outside the heating chamber and configured for generating microwaves; and a controller, coupled to the microwave transmitters and configured for controlling the microwave transmitters so that each of the microwave transmitters outputs the microwave with a specific frequency, phase, and power, and the microwave heating method comprises:

step 1: calculating an electric field mode distribution at each frequency point generated by the microwave to be outputted from each input port;

step 2: changing the frequency, phase, and power of the microwave to be outputted from each input port in each of a plurality of time periods to generate a corresponding electric field mode distribution of each of the input port in each of the plurality of time periods;

step 3: synthesizing the electric field mode distributions to be outputted by the input ports in the time periods calculated in step 2 into synthesized electric field mode distributions corresponding to the time periods;

step 4: calculating and adding up the power density distributions calculated in step 3 in the time periods and calculating a total power density distribution;

step 5: calculating whether spatial uniformity of the total power density distribution calculated in step 4 is greater than a target value, wherein step 6 is performed if the spatial uniformity is greater than the target value; otherwise step 1 is performed again; and step 6: heating, by the controller, the object to be heated in stages through the microwave corresponding to the frequency, phase, and power emitted by the microwave transmitter corresponding to each input port in each of the time periods predetermined in step 1 to step 5.

7. The method according to claim 6, wherein in step 2, lengths of time of the time periods to generate the corresponding electric field mode distribution are not equal.

8. The method according to claim 6, wherein in step 4, the power density distributions in the time periods are different from one another.

9. The method according to claim 6, wherein in step 1, the frequency of the microwave outputted from each input port ranges from 2 GHz to 4 GHz.

10. The method according to claim 6, wherein a range of the phase of the microwave outputted from each input port is 64 phases.

11. The method according to claim 6, wherein the target value is 99%.

12. A microwave heating device, comprising:

a heating chamber, having an accommodating space;

a carrier, disposed in the accommodating space and having a flat surface configured for carrying an object to be heated;

a plurality of microwave transmitters, disposed outside the heating chamber and configured for generating microwaves; and a controller, coupled to the microwave transmitters, wherein the controller is configured to perform the following steps:

step 1: calculating an electric field mode distribution at each frequency point generated by the microwave to be outputted from each input port of the heating chamber;

step 2: changing the frequency, phase, and power of the microwave to be outputted from each input port to generate a corresponding electric field mode distribution of each of the input port;

step 3: synthesizing the electric field mode distributions to be outputted by the input ports calculated in step 2 into a synthesized electric field mode distribution;

step 4: calculating a power density distribution, wherein the power density distribution refers to a heating power density of the synthesized electric field mode distribution calculated in step 3 in a heating range of the object to be heated;

step 5: calculating whether spatial uniformity of the power density distribution calculated in step 4 is greater than a target value, wherein step 6 is performed if the spatial uniformity is greater than the target value; otherwise step 1 is performed again; and step 6: heating, by the controller, the object to be heated through the microwave corresponding to the frequency, phase, and power emitted by the microwave transmitter corresponding to each input port predetermined in step 1 to step 5.

13. The microwave heating device according to claim 12, wherein the heating chamber has a plurality of input ports, and the microwave transmitters are connected to the input ports to input the microwaves to heating chamber.

14. The microwave heating device according to claim 13, wherein the input ports are located on a side wall or an upper wall of the heating chamber.

15. The microwave heating device according to claim 13, wherein a number of the input ports is greater than or equal to a number of the microwave transmitters.

16. The microwave heating device according to claim 12, wherein each of the microwave transmitters comprises:

a microwave generator, connected to the controller, configured to generate the microwave;

a phase shifter, connected to the controller, configured to change the phase of the microwave; and a power amplifier module, connected to the controller, configured to change the power of the microwave.

17. The microwave heating device according to claim 16, wherein the phase shifter is a 6-bit digital phase shifter.

18. The microwave heating device according to claim 16, wherein the solid-state power amplifier is a two-stage amplifier or a three-stage amplifier.

19. The microwave heating device according to claim 12, wherein the carrier is a fixed carrier.

* * * * *